United States Patent
Baars et al.

(10) Patent No.: US 8,609,457 B2
(45) Date of Patent: Dec. 17, 2013

(54) SEMICONDUCTOR DEVICE WITH DRAM BIT LINES MADE FROM SAME MATERIAL AS GATE ELECTRODES IN NON-MEMORY REGIONS OF THE DEVICE, AND METHODS OF MAKING SAME

(75) Inventors: Peter Baars, Dresden (DE); Till Schloesser, Dresden (DE); Frank Jakubowski, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 181 days.

(21) Appl. No.: 13/099,692

(22) Filed: May 3, 2011

(65) Prior Publication Data
US 2012/0280296 A1 Nov. 8, 2012

(51) Int. Cl.
*H01L 21/00* (2006.01)
*H01L 21/8242* (2006.01)

(52) U.S. Cl.
USPC ............ 438/74; 438/128; 438/238; 438/239; 438/253; 257/68; 257/296; 257/E27.084; 257/E27.088; 257/E21.648

(58) Field of Classification Search
USPC ............ 257/71, E27.084, E27.086, E27.087, 257/E27.088, E27.091, E27.094, E27.097, 257/E21.646, E21.656–E21.658, 68, 225, 257/296, 300, 306, E27.098, E29.17, 257/E21.645, E21.648, E21.657, E21.66, 257/E21.678; 438/183, 253, 259, 270, 48, 438/74, 128, 238, 239, 256, 258
See application file for complete search history.

(56) References Cited

U.S. PATENT DOCUMENTS

| | | | |
|---|---|---|---|
| 6,359,301 B1 * | 3/2002 | Kuroda | 257/306 |
| 6,600,186 B1 | 7/2003 | Lee et al. | |
| 6,853,024 B1 | 2/2005 | Tu | |
| 7,633,109 B2 | 12/2009 | Lee et al. | |
| 7,772,631 B2 | 8/2010 | Schloesser | |
| 2004/0201053 A1 | 10/2004 | Tu et al. | |
| 2006/0255384 A1 | 11/2006 | Baars et al. | |
| 2007/0037334 A1 | 2/2007 | Muemmler et al. | |
| 2011/0027988 A1 | 2/2011 | Hwang et al. | |

OTHER PUBLICATIONS

Schloesser et al., "A 6F2 Buried Wordline DRAM Cell for 40nm and Beyond," 2008 IEEE, pp. 809-812.

* cited by examiner

*Primary Examiner* — Cuong Q Nguyen
*Assistant Examiner* — Galina Yushina
(74) *Attorney, Agent, or Firm* — Williams, Morgan & Amerson, P.C.

(57) ABSTRACT

Generally, the present disclosure is directed to a semiconductor device with DRAM bit lines made from the same material as the gate electrodes in non-memory regions of the device, and methods of making the same. One illustrative method disclosed herein comprises forming a semiconductor device including a memory array and a logic region. The method further comprises forming a buried word line in the memory array and, after forming the buried word line, performing a first common process operation to form at least a portion of a conductive gate electrode in the logic region and to form at least a portion of a conductive bit line in the memory array.

16 Claims, 8 Drawing Sheets

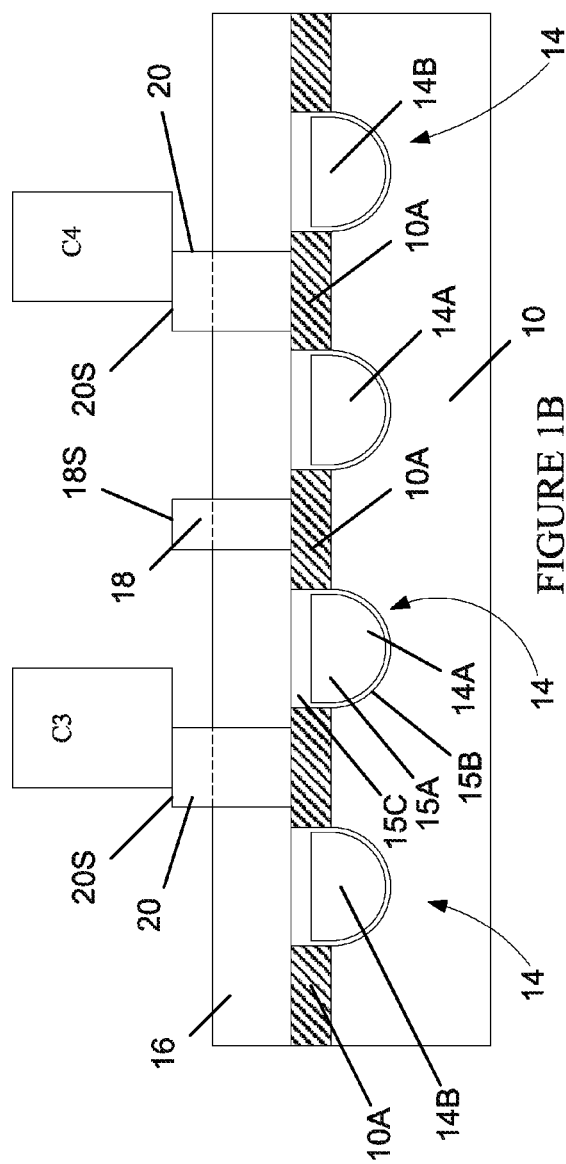
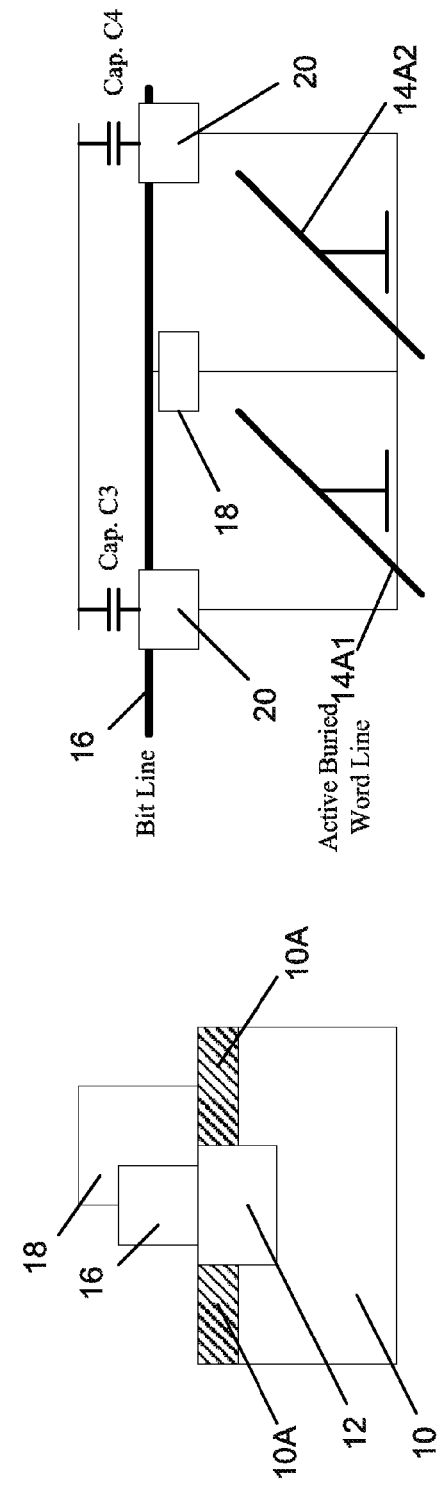

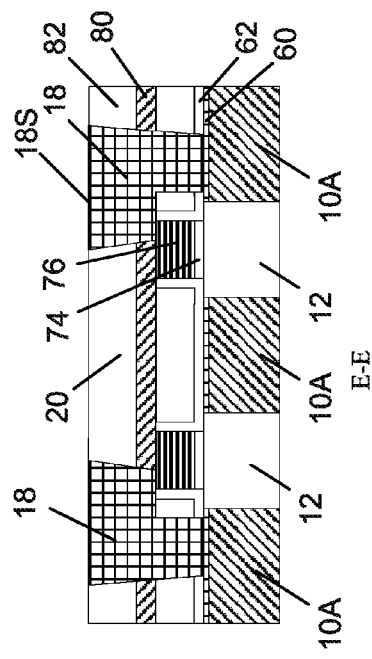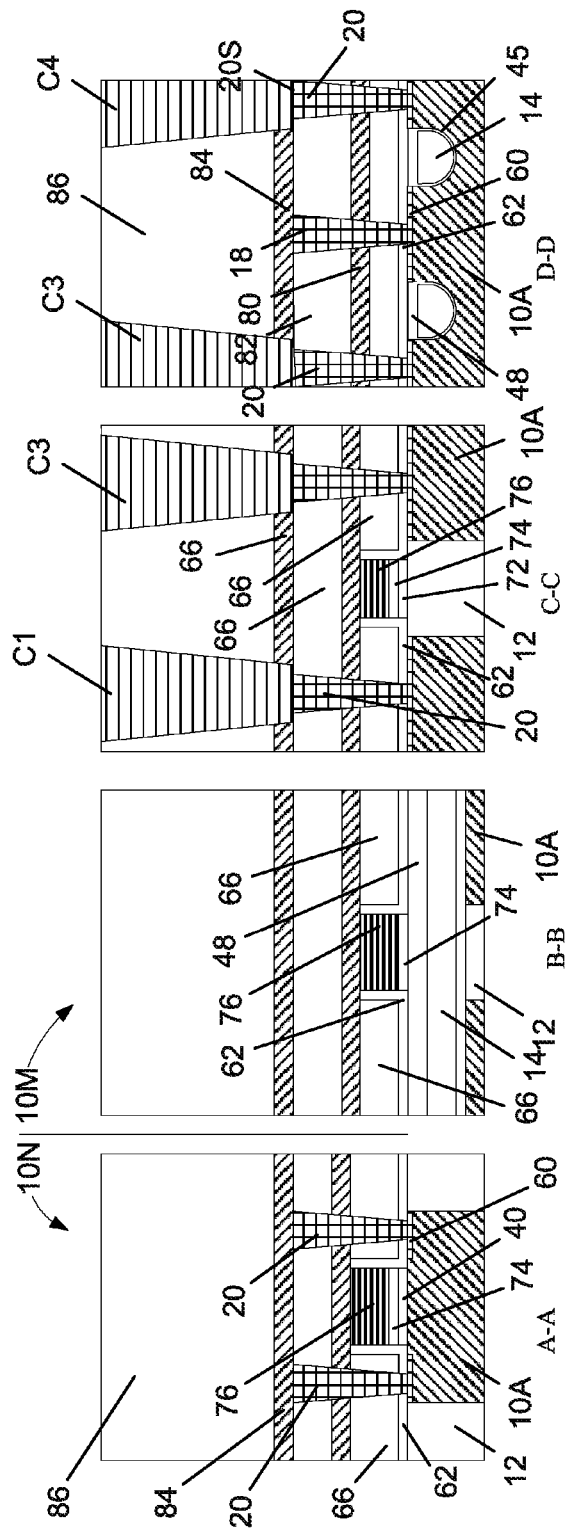
FIGURE 13
FIGURE 14

SEMICONDUCTOR DEVICE WITH DRAM BIT LINES MADE FROM SAME MATERIAL AS GATE ELECTRODES IN NON-MEMORY REGIONS OF THE DEVICE, AND METHODS OF MAKING SAME

BACKGROUND OF THE INVENTION

1. Field of the Invention

The present disclosure generally relates to the field of fabricating integrated circuits, and, more particularly, to a semiconductor device with DRAM bit lines made from the same material as the gate electrodes in non-memory regions of the device, and methods of making the same.

2. Description of the Related Art

In modern integrated circuits, a very high number of individual circuit elements, such as field effect transistors in the form of CMOS, NMOS, PMOS elements, resistors, capacitors and the like, are formed on a single chip area. Typically, feature sizes of these circuit elements are steadily decreasing with the introduction of every new circuit generation, to provide currently available integrated circuits with high performance in terms of speed and/or power consumption. A reduction in size of transistors is an important aspect in steadily improving device performance of complex integrated circuits, such as CPUs. The reduction in size commonly brings about an increased switching speed, thereby enhancing signal processing performance, while, however, increasing dynamic power consumption of the individual transistors. That is, due to the reduced switching time interval, the transient currents upon switching a MOS transistor element from logic low to logic high are significantly increased.

In addition to the large number of transistor elements, a plurality of passive circuit elements, such as capacitors, are typically formed in integrated circuits that are used for a plurality of purposes, such as charge storage for storing information, for decoupling and the like. Decoupling in integrated circuits is an important aspect for reducing the switching noise of the fast switching transistors, since the decoupling capacitor may provide energy at a specific point of the circuitry, for instance at the vicinity of a fast switching transistor, and thus reduce voltage variations caused by the high transient currents which may otherwise unduly affect the logic state represented by the transistor.

Due to the decreased dimensions of circuit elements, not only the performance of the individual transistor elements may be increased, but also their packing density may be improved, thereby providing the potential for incorporating increased functionality into a given chip area. For this reason, highly complex circuits have been developed, which may include different types of circuits, such as analog circuits, digital circuits and the like, thereby providing entire systems on a single chip (SoC). Furthermore, in sophisticated microcontroller devices and other sophisticated devices, an increasing amount of storage capacity may be provided on chip with the CPU core, thereby also significantly enhancing the overall performance of modern computer devices. For example, in typical micro-controller designs, different types of storage devices may be incorporated so as to provide an acceptable compromise between die area consumption and information storage density versus operating speed. For example, static RAM memories may be formed on the basis of registers, thereby enabling an access time determined by the switching speed of the corresponding transistors in the registers. Typically, a plurality of transistors may be required to implement a corresponding static RAM cell, thereby significantly reducing the information storage density compared to, for instance, dynamic RAM (DRAM) memories including a storage capacitor in combination with a pass transistor. Thus, a higher information storage density may be achieved with DRAMs, although at a reduced access time compared to static RAMs, which may nevertheless render dynamic RAMs attractive in complex semiconductor devices.

Complex integrated circuit devices typically include a memory array, such as an embedded DRAM array, and other non-memory circuits, e.g., logic circuits (such as microprocessors), located outside of the memory array. One problem associated with manufacturing such complex devices is that some designers and manufacturing engineers tend to treat the regions outside the memory array and the memory array itself as completely separate items, each with their own unique design rules and process flows. As a result, in some cases, manufacturing such complex devices is not as cost-effective or efficient as it could be. For example, by independently focusing on one region to the exclusion of the other, additional manufacturing operations may be performed only in that one region, which tends to require additional manufacturing time, makes the resulting device more costly, and may lead to decreased product yields.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a semiconductor device with DRAM bit lines made from the same material as the gate electrodes in non-memory regions of the device, and methods of making the same.

One illustrative method disclosed herein comprises forming a semiconductor device including a memory array and a logic region. The method further comprises forming a buried word line in the memory array and, after forming the buried word line, performing a first common process operation to form at least a portion of a conductive gate electrode in the logic region and to form at least a portion of a conductive bit line in the memory array.

One illustrative semiconductor device disclosed herein comprises a memory array including a buried word line and a bit line and a logic region located outside of the memory array, the logic region including a transistor that comprises a gate electrode, wherein the bit line and the gate electrode are made of the same conductive material.

BRIEF DESCRIPTION OF THE DRAWINGS

The disclosure may be understood by reference to the following description taken in conjunction with the accompanying drawings, in which like reference numerals identify like elements, and in which:

FIG. 1A-1C are various views of an illustrative semiconductor device comprising a memory array and regions outside of the memory array as described herein;

FIG. 2 is simplified electrical schematic for one illustrative embodiment of a semiconductor device disclosed herein;

FIGS. 4-14 depict illustrative methods that may be employed as described herein in manufacturing all or part of the illustrative semiconductor device described herein.

Figure 1A:
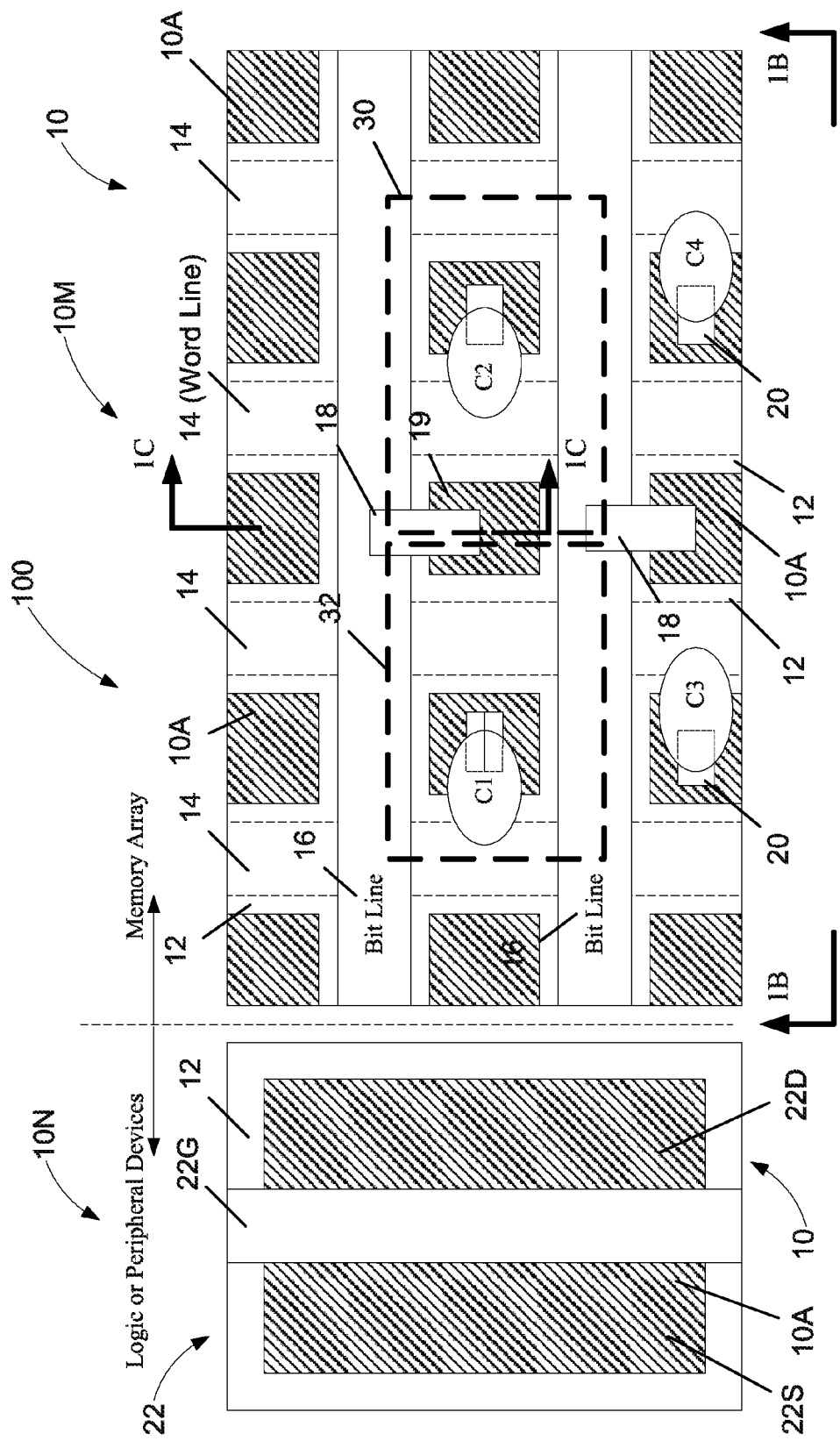

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is generally related to a semiconductor device that includes at least one memory array, such as an embedded DRAM (eDRAM) array, and additional circuits outside of the memory array, such as logic circuits, peripheral circuits, etc.

(hereinafter generically referred to as "logic circuits" or "logic devices" or "logic reasons"). In one particular embodiment disclosed herein, the bit lines (or portions thereof) in the memory array are manufactured at the same time that the gate electrodes of the transistors in logic circuits are manufactured. The methodologies disclosed herein may be used with both "gate first" and "gate last" manufacturing techniques. As those skilled in the art will appreciate, the "gate last" approach is becoming a more popular technique used in manufacturing high-performance semiconductor devices, such as high-performance microprocessors, as it permits the device designer to employ metal based electrodes, such as aluminum, lanthanum, titanium nitride, etc., as the material for the gate electrode of the basic transistor device. Such metal based gate electrode materials when used in combinations with other features, such as the use of so-called "high-k" dielectric materials (k greater than 10), may result in improved performance of integrated circuit devices, such as NMOS and PMOS devices.

With reference to FIGS. 1A-1C, one illustrative embodiment of a novel semiconductor device 100 will now be described in more detail. FIG. 1A is a plan view of the device 100. FIG. 1B is a cross-sectional side view and FIG. 1C is a partial cross-sectional view of the device 100. The sections are taken as indicted in FIG. 1A.

As shown in FIG. 1A, the semiconductor device 100 is formed in and above a semiconducting substrate 10. The semiconductor device 100 includes a memory array 10M and one or more semiconductor devices, e.g., an illustrative field effect transistor 22, located in a region 10N outside of the memory array 10M. The substrate 10 may be made of any semiconducting material, e.g., silicon, and the substrate may have a silicon-on-insulator (SOI) configuration, or it may have a bulk configuration. In one illustrative embodiment, the memory array 10M depicted herein is an embedded DRAM device, although the methods disclosed herein may be employed with other forms of memory devices.

The memory array 10M depicted in FIG. 1A includes a plurality of active regions 10A defined in the substrate 10 by one or more isolation structures 12, such as illustrative shallow trench isolation structures. The memory array 10M also includes a plurality of buried word lines 14 (shown with dashed lines in FIG. 1A), a plurality of bit lines 16, a plurality of stacked capacitors (C1-C4), a plurality of illustrative bit-line-to-active conductive contacts 18 ("BLA contacts"), and a plurality of illustrative active-to-capacitor conductive contacts 20 ("AC contacts"). The memory array 10M includes a plurality of unit memory cells, two of which indicated by the dashed lines 30, 32. The BLA contact 18 is shared between the unit cells 30, 32. The shared BLA contact 18 is conductively coupled to a shared source region 19. For sake of clarity, various doped regions, such as illustrative source/drain regions that are typically formed by implanting dopant ions into the substrate 10 are not depicted in the memory array 10M or the region 10N so as to not obscure the present inventions.

The illustrative transistor 22 formed in the illustrative logic region 10N is also depicted in FIG. 1A. The transistor 22 is intended to be both generic and illustrative in nature as it is intended to represent, in one embodiment, any transistor that may be formed outside of the memory array 10M. Moreover, the illustrative transistor 22 may be of traditional construction and materials and it may be formed using traditional techniques. Thus, the illustrative details for the transistor 22 depicted herein should not be considered a limitation of the various inventions disclosed and claimed herein. In one illustrative embodiment, the transistor 22 is formed in and above an active region 10A defined in the substrate 10 by an isolation structure 12, such as an illustrative shallow trench isolation structure. The illustrative transistor 22 includes a gate electrode 22G, a gate insulation layer 221 (not shown in FIG. 1A), a source region 22S and a drain region 22D. Various details, such as sidewall spacers, are omitted in FIG. 1A for purposes of clarity.

FIG. 1B is a cross-sectional side view of the memory array 10M taken as indicated in FIG. 1A. As shown in FIG. 1B, the device 100 includes a plurality of schematically depicted buried word lines 14, two of which are active buried word lines 14A, while the other two are isolating buried word lines 14B. The buried word lines 14 may have any of a variety of known configurations and the may be manufactured using a variety of known techniques. For example, in one illustrative embodiment, the buried word lines 14 may be comprised of a gate electrode 15A, a gate insulation layer 15B, and it is covered with a generically depicted insulating material 15C. The nature and composition of the insulating material 15C, as well as the time it is formed in one illustrative process flow disclosed herein is discussed further below. For example, the gate electrode 15A may be comprised of polysilicon and the gate insulation layer may be made of silicon dioxide. In one illustrative embodiment, the buried word lines 14 may have the structure and may be made as described in U.S. Pat. Nos. 7,772,631 and 7,633,109, both of which are hereby incorporated by reference in their entirety. The exact details of construction of the buried word lines 14 is not depicted in FIG. 1B so as not to obscure the present invention.

Also depicted in FIG. 1B are a plurality of active-to-capacitor contacts 20 ("AC contacts"), associated stacked capacitors C3, C4, and an illustrative BLA contact 18. Of course, after a complete reading of the present application, those skilled in the art will appreciate that the configuration of the various structures depicted herein, for example, the contacts 18, 20 depicted in FIGS. 1A-1C, are illustrative in nature as they may be modified depending upon the particular application. Similarly, the illustrative stacked capacitors C3, C4 are exemplary in nature as various forms of capacitor structures, such as single-sided capacitors, double-sided capacitors, etc., may be employed with the illustrative device 100 described herein. As will be described more fully below, in one illustrative embodiment, the upper surface 20S of the AC contacts 20 and the upper surface 18S of the BLA contacts 18 are at the same level as they are formed at the same time. For clarity, various dielectric layers are not depicted in FIGS. 1A-1C. It should be understood that reference to the surfaces as "upper surfaces" is only intended to convey the relative position of those surfaces relative to the surface of the substrate, and it is not intended to describe the absolute position of those surfaces relative to ground.

FIG. 1C is a partial cross-sectional view of the memory array 10M taken as indicated in FIG. 1A. As shown therein, an illustrative trench isolation 12 separates two active regions 10A. An illustrative bit line 16 is formed above the trench isolation 12. The bit line 16 and the BLA contact 18 may have any desired size, shape or configuration. In one illustrative embodiment, as describe more fully below, the bit line 16 will be manufactured at the same time as the gate electrode 22G for the transistor 22. As a result the bit line 16 will be made of the same material as the gate electrode 22G. Of course, in some cases the gate electrode 22G may be comprised of a single material, like a silicided polysilicon in a "gate-first" approach, or a plurality of conductive materials, e.g., aluminum, titanium nitride, tantalum nitride, aluminum titanium, etc. in a high-k, metal gate, "gate-last" approach. Thus, is should be understood that when this application states that the bit line 16 and the gate electrode 22G are made of the same material and that they are manufactured at the same time, what is meant is that at least one conductive material that comprises the gate electrode 22G is used to form at least a portion of the conductive bit line 16. Of course, if desired, the conductive portion of the bit line 16 can have the identical configuration to the conductive gate electrode 22G of the transistor 22.

FIG. 2 is a simplified electrical schematic that depicts the basic components and operation of the two illustrative memory unit cells 30, 32 depicted in FIG. 1A. In general, a voltage is applied to the bit line 16. Each of the active buried word lines 14A1, 14A2 acts as a "pass transistor" that controls access to their respective capacitors C3, C4. For example, when the active word line 14A1 is energized, assuming a "logical high" voltage (representing a "1") is applied to the bit line 16, this "logical high" voltage charges the capacitor C3 so that a "1" is stored on the capacitor C3.

Figure 3:
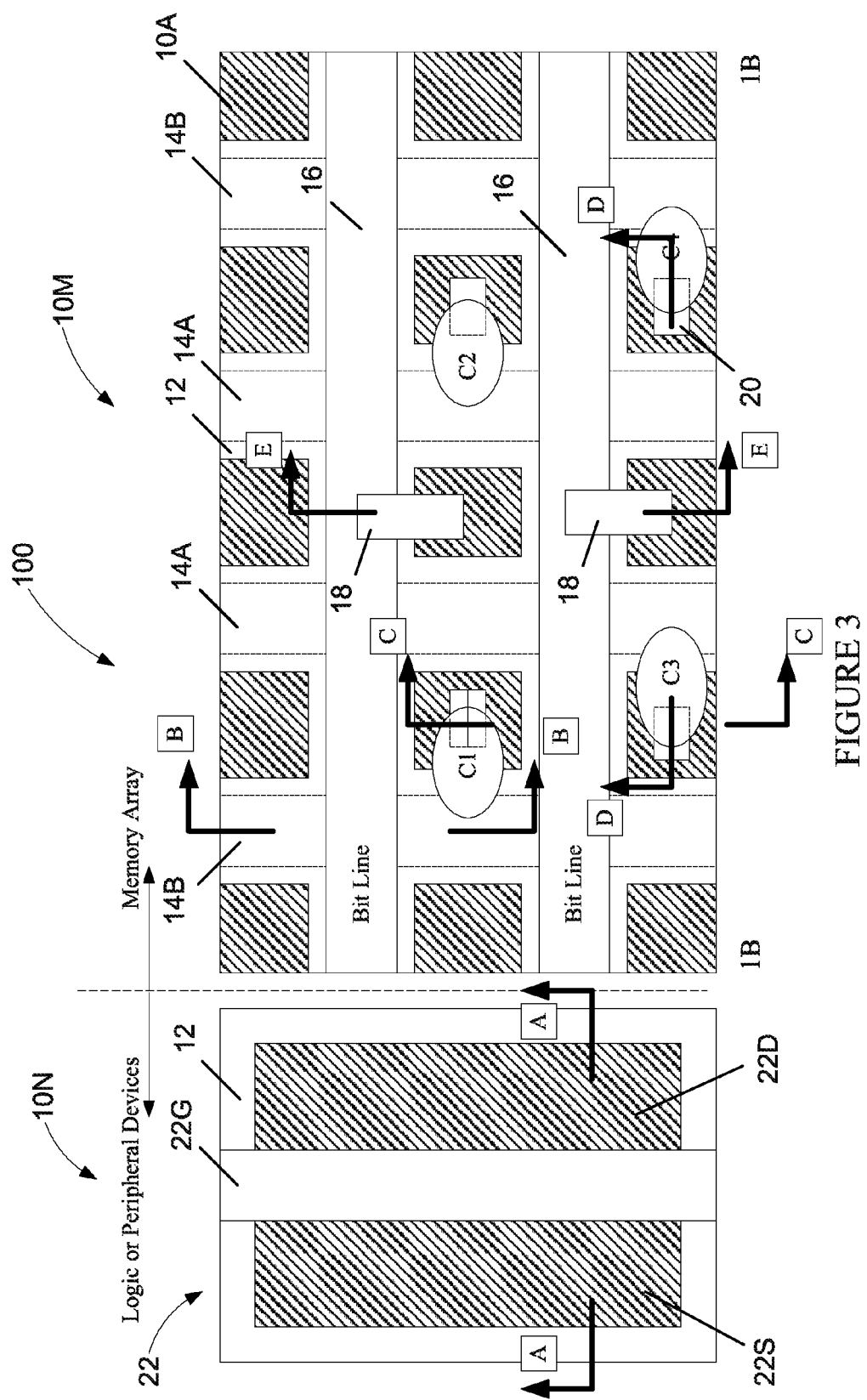
FIG. 3 is a plan view of one illustrative embodiment of a semiconductor device disclosed herein wherein various views of later cross-sectional drawings are taken.

FIG. 3 is a reproduction of FIG. 1A with the views taken in subsequent drawings indicated thereon. More specifically, the view "A-A" is a cross-sectional view of the illustrative transistor 22 taken parallel to the gate length of the transistor 22 and perpendicular to the gate width of the transistor 22; the view "B-B" is a partial cross-sectional view of the memory array 10M taken through a buried word line 14 and perpendicular to a bit line 16; the view "C-C" is a partial cross-sectional view of the memory array 10M taken through the substrate 10 parallel to the buried word line 14; and the view "D-D" is a partial cross-sectional view of the memory array 10M taken through the substrate 10 perpendicular to a buried word line 14 and parallel to a bit line 16. These various views are depicted in subsequent FIGS. 4-14. The view "E-E" in FIG. 3 is a partial cross sectional view that is taken perpendicular to the bit lines 16 and through the BLA contact 18, and this view is only depicted in FIG. 13.

Figure 4:
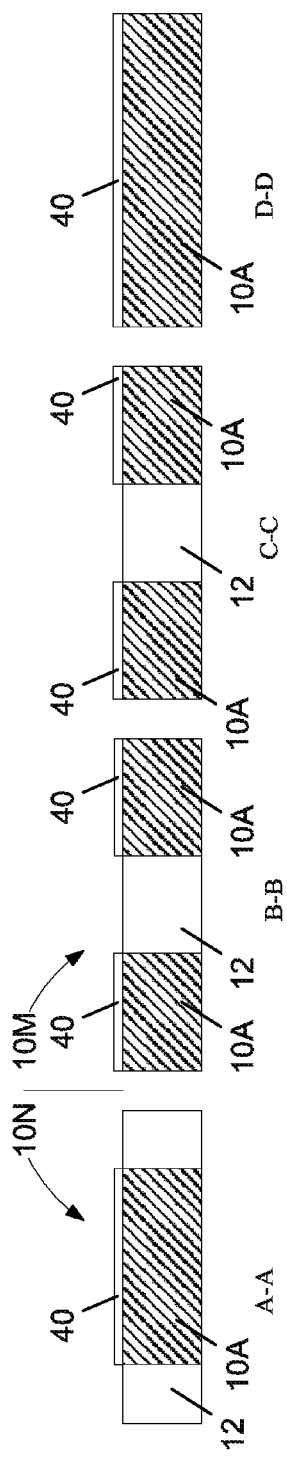

One illustrative process flow for forming the device 100 will now be described. As shown in FIG. 4, the process begins with the formation of the isolation regions 12, e.g., shallow trench isolations, in the substrate 10, to thereby define the plurality of active areas 10A. The isolation structures 12 may be formed using traditional techniques and materials, e.g., by performing one or more etching processes and deposition processes followed by a chemical mechanical polishing process. The isolation structure 12 may be made of any desired insulating material, e.g., silicon dioxide. Also depicted in FIG. 4 is an illustrative gate insulation layer 40 that is formed on the exposed silicon surfaces in the memory array 10M and in the region 10N. As with the isolation structures 12, the gate insulation layer 40 may be formed using traditional techniques and materials. For example, the gate insulation material may be comprised of a layer of silicon dioxide having a thickness ranging from 3-8 nm, and if may be formed by performing thermal growth process or by performing a deposition process, such as an atomic layer deposition (ALD) process.

Figure 5:
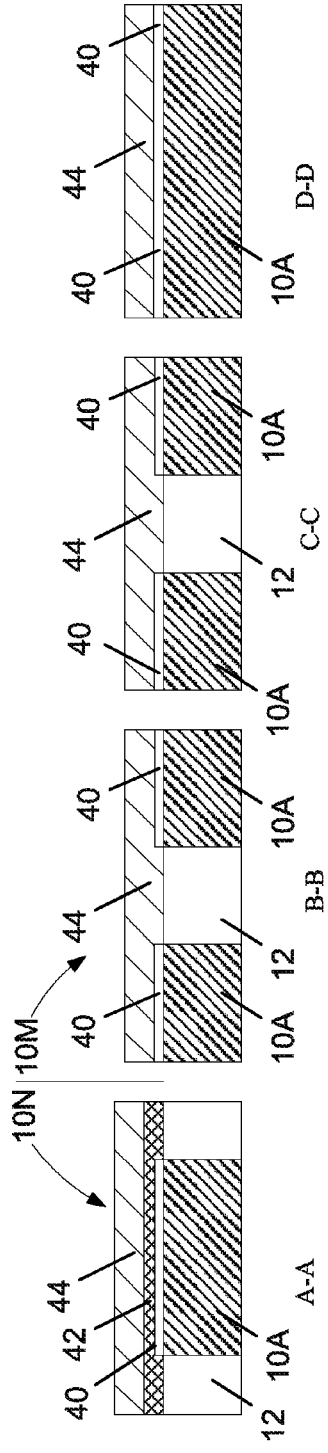

Next, as shown in FIG. 5, a relatively thin layer of polysilicon 42 is formed only in the region 10N. In one illustrative embodiment, this may be accomplished by depositing a layer of polysilicon across the substrate 10, forming a masking layer (not shown) above the region 10N, and thereafter performing one or more etching processes to remove the layer of polysilicon 42 from the memory array 10M. The layer of polysilicon 42 is typically formed so as to protect the gate insulation layer 40 formed in the region 10N, and it may have a thickness of approximately 6-9 nm. Thereafter, as shown in FIG. 5, an layer of material 44 may be blanket-deposited across the substrate 10 in both the memory array 10M and the region 10N. The layer of material 44 may be formed using traditional techniques and it may be comprised of a variety of different materials. For example, the layer of material 44 may be made from silicon nitride, silicon oxynitride or the like, it may have a thickness ranging from 30-100 nm, and it may be formed by performing a deposition process, such as a chemical vapor deposition (CVD) process or a furnace deposition process.

Figure 6:
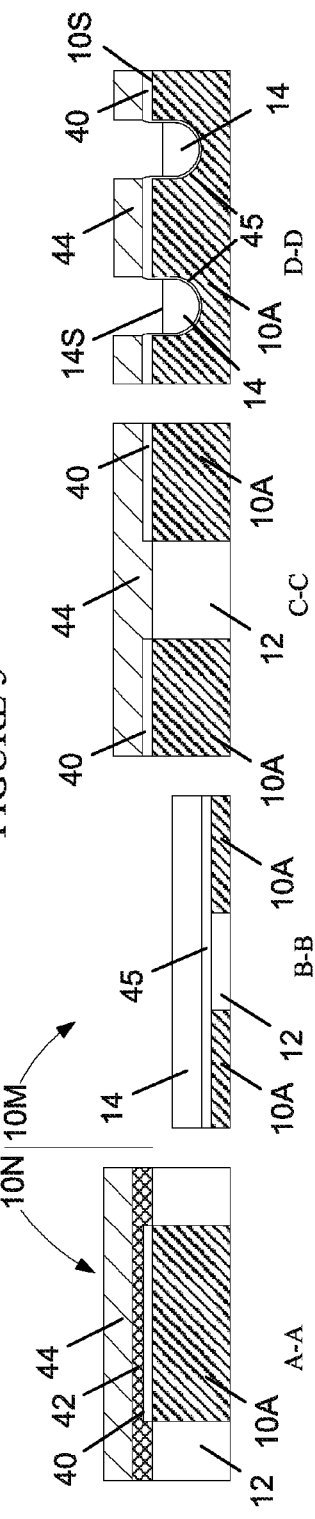

Next, as shown in FIG. 6, an appropriate masking layer (not shown), e.g., photoresist, is formed to cover the region 10N and expose the areas of the memory array 10M where the buried word lines 14 will be formed, i.e., portions of the isolation regions 12 and the active region 10A will be exposed. Thereafter, one or more etching processes, e.g., a wet etching process, is performed to remove the desired portions of the isolation structures 12.

Thereafter, a gate insulation layer 45 is formed on the substrate 10. As with the gate insulation layer 40 described above, the gate insulation layer 45 may be formed from a variety of materials using a variety of techniques, e.g., the gate insulation layer 45 may be a thermally grown layer of silicon dioxide having a thickness of 3-8 nm. Thereafter, the conductive material that will make up the word line 14 is formed above the insulation layer 45. The conductive materials that are used to make the word lines 14 may vary depending upon the application. In one illustrative embodiment, the conductive materials of the word line 14 may comprise a titanium nitride (TiN) liner in combination with the remainder being made of tungsten (W). Of course, a combination of conductive materials is not required in all cases. The conductive material(s) for the word lines 14 may be formed by performing one or more deposition processes, such as a chemical vapor deposition (CVD) processes. Thereafter, an illustrative etching process may be performed to remove portions of the conductive material of the word lines 14 so that the resulting word line 14 is confined to the region of the isolation structure 12. Additionally, the etching process, such as a dry anisotropic etching process or a dry etching process in combination with a CMP process, may be performed for a sufficient duration such that the surface 14S of the word line 14 is recessed beneath the surface 10S of the substrate 10. The recess will permit the formation of insulating materials above the word line 14 and thus electrically isolate, the word line 14, as described more fully below.

Figure 7:
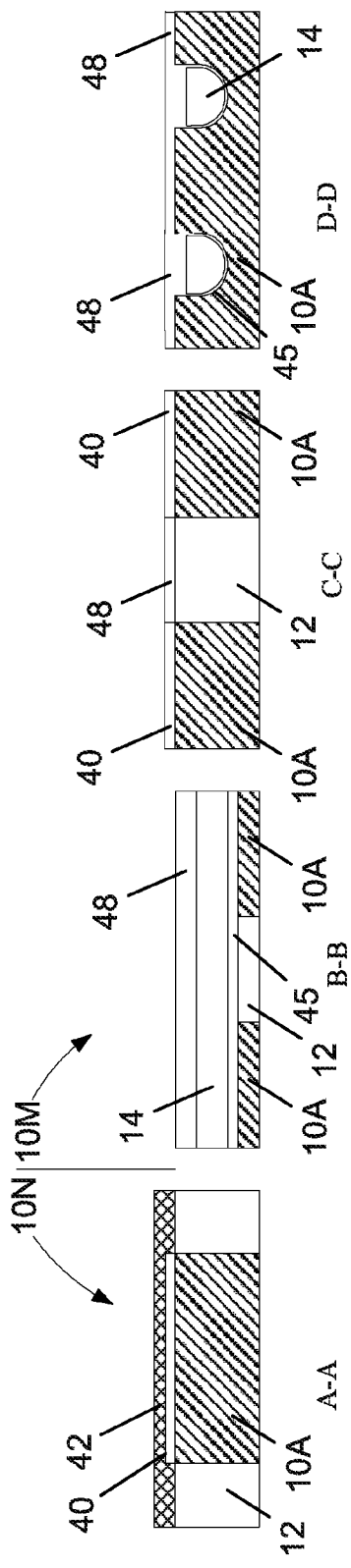

Next, as shown in FIG. 7, as mentioned above, a layer of insulating material 48 is formed above the word lines 14 to electrically isolated the buried word lines 14. The layer of insulating material 48 may be formed from a variety of different materials, e.g., silicon dioxide, TEOS, HDP, etc., and it may be made by performing one or more deposition processes, such as a chemical vapor deposition (CVD) process. In one illustrative embodiment, the layer of insulating material 48 is deposited to such a thickness that it over-fills the recess and extends above the layer of material 44 (not shown in FIG. 7 but see FIG. 6). A CMP process is then performed using the layer of material 44 as a CMP stop to remove excess amounts of the layer of insulating material 48. Thereafter, the layer of material 44 may be removed by performing an etching process, such as an illustrative wet etching process, e.g., a wet nitride strip, to thereby result in the structure shown in FIG. 7.

Figure 8:
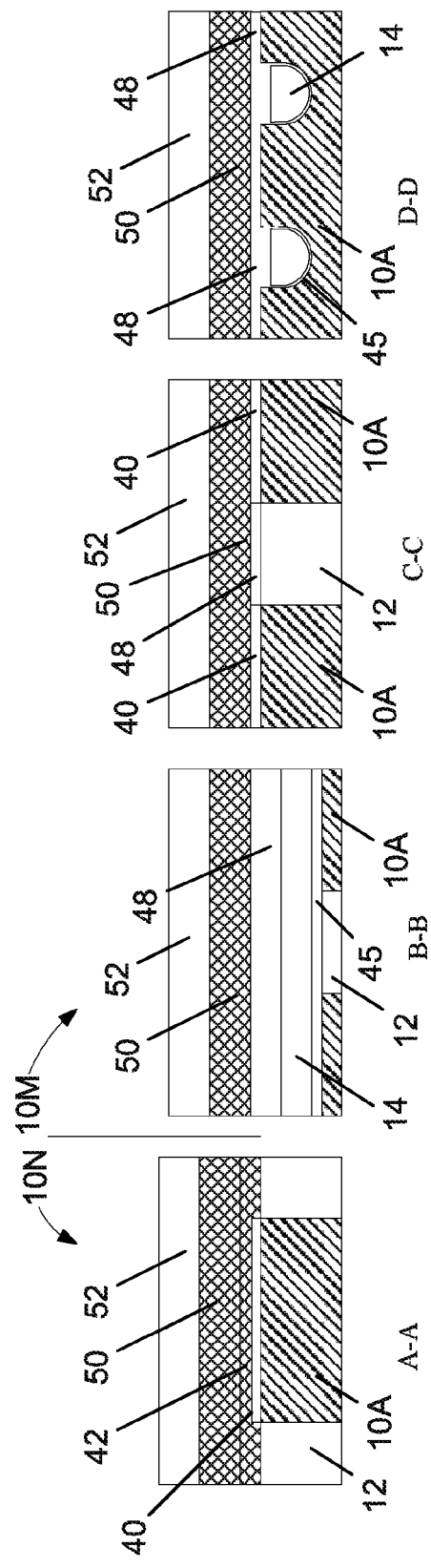

Next, as shown in FIG. 8, a layer of conductive material 50 and a layer of material 52 are each formed above the regions 10N, 10M of the device 100. In one illustrative example, the layer of conductive material 50 is polysilicon and it is, in effect, added to the thickness of the protection layer of polysilicon 42 previously formed in the region 10N. Of course, the layer of conductive material 50 may be comprised of other conductive materials. In some cases, the protection layer of polysilicon 42 may be removed prior to formation of the conductive layer 50. In the memory array 14, the layer of conductive material 50 is formed on the layer of insulating material 48 (see section "B-B") and above the gate insulation layer 40 (see section "C-C"). Of course, the layer of conductive material 50 may be made from a variety of materials, and it may have a multiple layer construction. Similarly, the layer of material 52 may be comprised of a variety of insulating or etch stop materials, e.g., silicon nitride, and it may be formed by a CVD deposition process.

Figure 9:
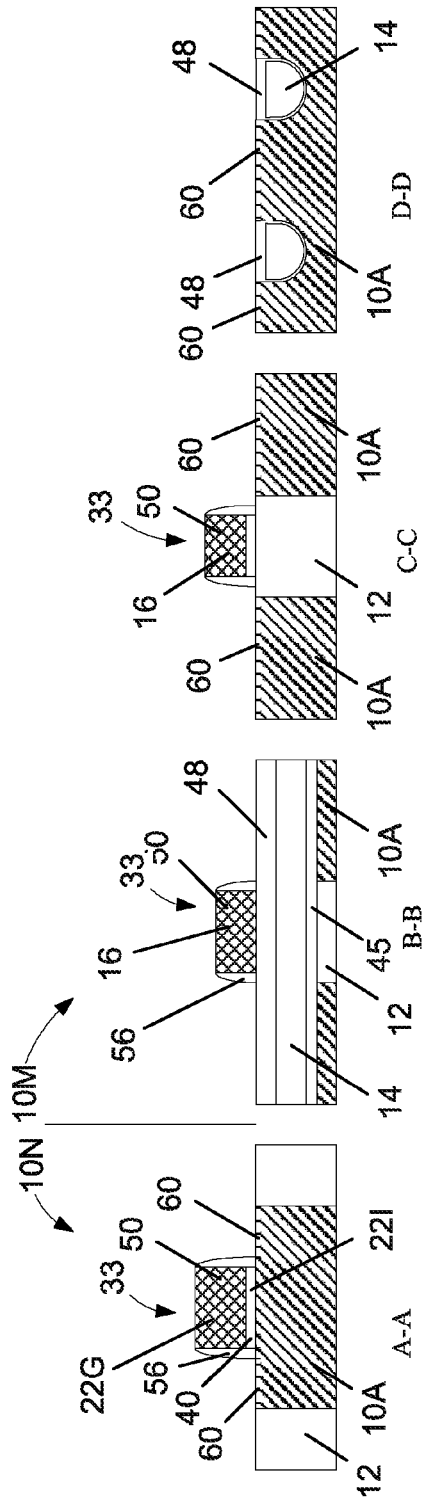

Next, as shown in FIG. 9, the illustrative process flow continues with the formation of gate structures 33, such as gate patterning, sidewall spacer formation, followed by the formation of source/drain regions and metal silicide regions if desired. More specifically, as shown in region 10N, the gate structure 33 for the transistor 22 comprises the gate electrode 22G (which, in one example, is made from the layer of conductive material 50 and the layer of conductive material 42), sidewall spacers 56, and gate insulation layer 221 (also indicated as layer 40). Also indicated in FIG. 9 is the formation of the bit line 16 from the conductive material 50. The sidewall spacers 56 may be formed by depositing a layer of spacer material (not shown) and thereafter performing an anisotropic etching process. Also depicted in FIG. 9 are illustrative metal silicide regions 60, e.g., nickel silicide, that may be formed by traditional techniques. For clarity, the implanted source/drain regions are not depicted in FIG. 9, but they may be formed by traditional techniques, e.g., an extension implant, followed by spacer formation, followed by a source/drain implant, followed by performing an anneal process to activate the implanted dopant material and repair lattice damage.

At this point, assuming a "gate-first" approach is involved in manufacturing the device 100, it can be seen that the gate electrode 22G outside of the memory array 10M and the bit lines 16 are made of the same conductive material, and they are made at the same time. Of course, as indicated previously, the conductive portions of the gate electrodes 22G and the bit lines 16 need not be identical, although they may be. For example, in the case where a work-function adjusting conductive material, e.g., titanium nitride, is formed as part of the gate electrode 22G, followed by, for example, performing a tungsten fill process to form the remainder of the gate electrode 22G, the bit lines 16 may have the same structure (TiN+W) or the bit lines 16 may be comprised of only titanium nitride, or they may be comprised of only tungsten.

Figure 10:
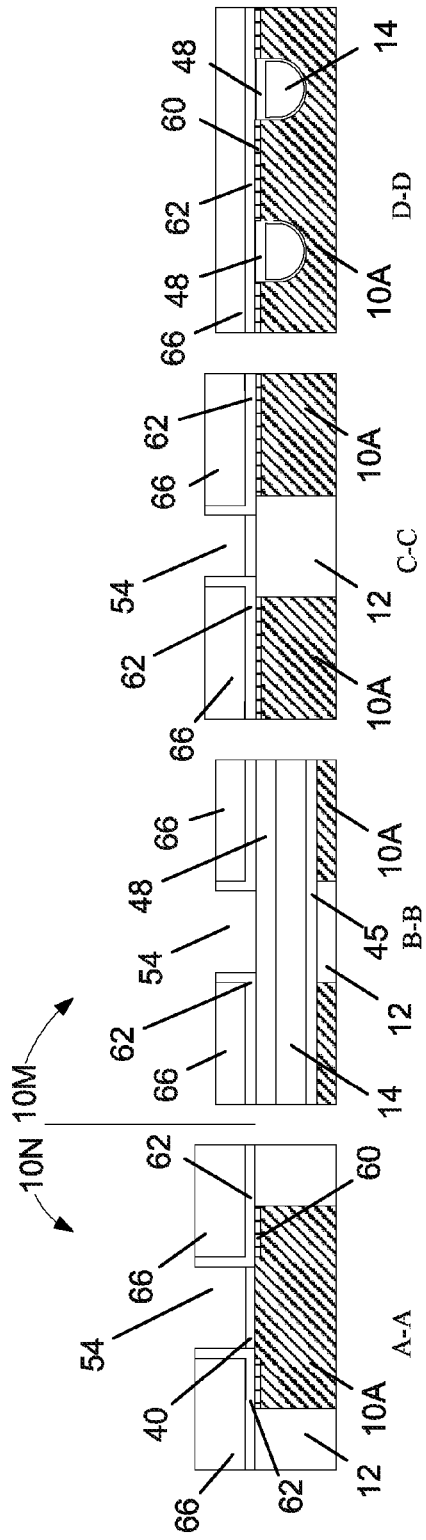

Next, as indcted in FIG. 10, where an illustrative "gate-last" technique is employed, a liner material layer 62 is conformally deposited over the "gate" structures 33 in the region 10N and in the memory array 10M, and thereafter a layer of insulating material 66 is blanket deposited in the regions 10N, 10M. Then, a CMP process is performed to expose the layer of conductive material 50 (the gate electrode 22G in the region 10N and the bit lines 16 in the memory array 10M). Thereafter, the conductive material 50 is removed to define gate cavities 54, which results in the structure depicted in FIG. 10. The conductive material 50 may be removed by performing a wet or dry etching process. The liner material layer 62, may be comprised of a variety of materials, such a silicon nitride, and it may be of the same composition as the sidewall spacers 56. The layer of insulating material 66 may be comprised of any type of insulating material, e.g., silicon dioxide, a high-k material, and it may be formed by performing a CVD process.

Figure 11:
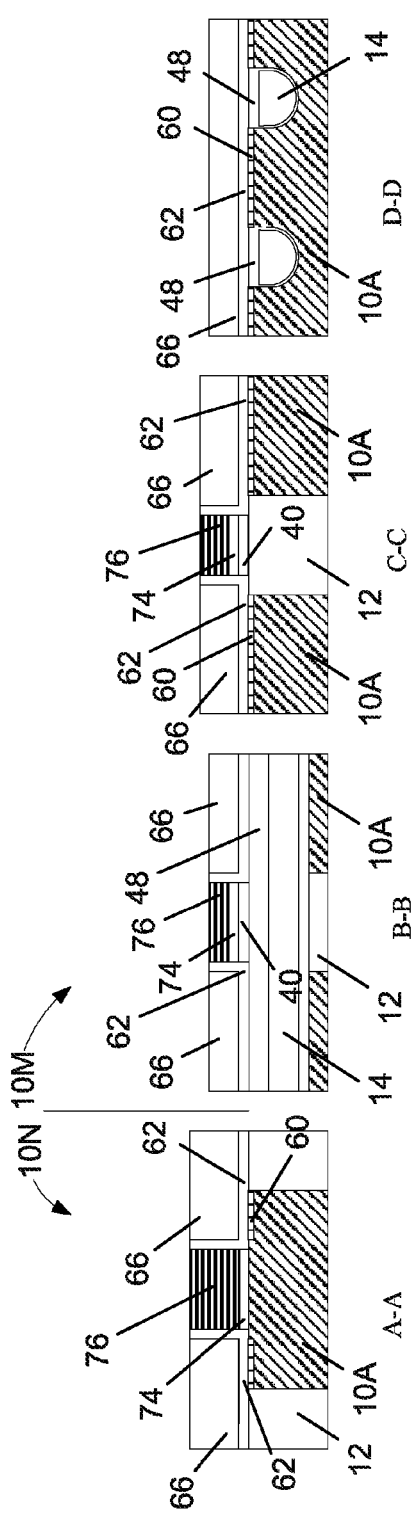

Next, as shown in FIG. 11, in the case where replacement gate technology is employed, a layer of high-k material 74 (k greater than 10) is formed in the region 10N and in the memory array 10M. More specifically, in the region 10N, the high-k material layer 74 is formed above the gate insulation layer 40. The high-k material layer 74 may be comprised of materials such as, for example, hafnium oxide, zirconium oxide, etc., and it may be formed by a CVD process. Thereafter, a layer of metal 76 is formed in the regions 10N, 10M above the high-k material layer 74. In some embodiments, the layer of metal 76 may comprise at least two separate material layers. In some examples, the layer of metal 76 may consist entirely of aluminum, while in other cases, the layer of metal 76 may have a dual layer construction, e.g., a layer of titanium nitride followed by a layer of tungsten. In general, the gate electrode materials may be different for NMOS and PMOS devices.

Figure 12:
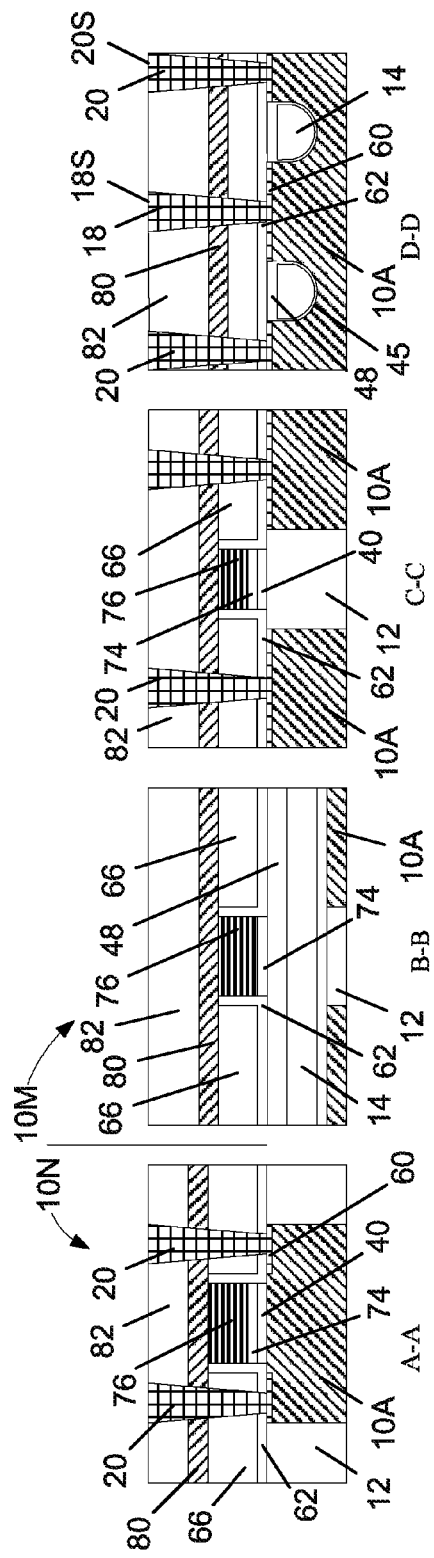

Next, as shown in FIGS. 12 and 13, the process continues with the formation of the BLA contacts 18 and the AC contacts 20. FIG. 13 depicts a partial cross-sectional view taken through the BLA contacts 18 as indicated in FIG. 3. The contacts 18, 20 may be made from a variety of different conductive materials (or combinations thereof) and they may be formed in traditional layers of dielectric materials. For example, the contacts 18, 20 may be made of aluminum, copper, tungsten, etc. As depicted in FIG. 12, a layer of material 80, e.g., silicon nitride, and a layer of insulating material 82, e.g., silicon dioxide, a high-k material, etc., are formed in the regions 10N, 10M. Traditional photolithographic and etching techniques may be performed to define the openings in which the contacts 18, 20 will be formed. FIG. 13 depicts one illustrative embodiment of the BLA contacts 18. As shown therein, the BLA contact 18 conductively couples the bit line 16 to a source region (not shown) formed in active region 10A. Importantly, given the use of the presently disclosed techniques, the BLA contacts 18 and the AC contacts 20 have the same surface height 18S, 20S (see section "D-D") and they may be formed at the same time, thereby reducing the number of operations performed as compared to prior art techniques where bit line contacts and contacts to the capacitors C1-C4 in the region 10M were formed at different times. Moreover, using prior techniques required the formation of additional layers of material as compared to the process described herein, with the resulting increases in cost and complexity of the manufacturing process.

FIG. 14 depicts the formation of the illustrative capacitor structures C1, C3 and C4. As noted earlier the capacitor structures are intended to be representative only, as they may have a variety of known constructions and they may be formed by a variety of known techniques. In forming the capacitors, a layer of material 84, e.g., silicon nitride, and a layer of insulating material 86, e.g., silicon dioxide, a high-k material, etc., are formed above the device 100 using traditional techniques. Higher level metallization layers (conductive lines and plugs) are formed (not shown) to conductively contact the contacts 20 in the region 10N and to conductively contact capacitors C1-C4 in the memory array 10M. Of course, the contacts 20 in the region 10N do not contact the capacitors C1-C4, rather they are conductively coupled to the source/drain regions 22S, 22G of the transistor 22.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor device comprising a memory array and a logic region, wherein said semiconductor device comprises a plurality of active regions defined in a semiconducting substrate, comprising:

forming a buried word line in said memory array;

after forming said buried word line, performing a first common process operation to form at least a portion of a conductive gate electrode in said logic region and to form at least a portion of a conductive bit line in said memory array; and performing a second common process operation to form an active region-to-capacitor conductive contact and a bit line-to-active region conductive contact in said memory array prior to forming a capacitor.

2. The method of claim 1, further comprising forming a conductive contact to a doped region of a transistor formed in said logic area during said second common process operation performed to form said active region-to-capacitor conductive contact and said bit line-to-active region conductive contact.

3. The method of claim 1, wherein an upper surface of said active region-to-capacitor conductive contact and an upper surface of said bit line-to-active region conductive contact are at the same level.

4. The method of claim 1, wherein performing said first common process operation to form at least a portion of said gate electrode and at least a portion of said bit line comprises performing at least one of a deposition process, an etching process and a chemical mechanical polishing process.

5. The method of claim 1, wherein said conductive gate electrode in said logic region and said conductive bit line in said memory array comprise the same conductive material.

6. The method of claim 1, wherein said conductive gate electrode in said logic region and said conductive bit line in said memory array comprise only a single common conductive material.

7. The method of claim 1, wherein performing said first common process operation to form at least a portion of said gate electrode and at least a portion of said bit line comprises performing a deposition process and thereafter performing a planarization process.

8. The method of claim 1, wherein said conductive gate electrode in said logic region is a final conductive gate electrode structure for said semiconductor device.

9. The method of claim 1, further comprising after forming said buried word line, removing said gate electrode in said logic region and forming a final conductive gate electrode structure comprising at least one metal layer in place of said removed gate conductive electrode in said logic region.

10. A method of forming a semiconductor device comprising a memory array, a logic region, a plurality of active regions defined in a semiconducting substrate and at least one capacitor, comprising:

forming a buried word line in said memory array;

after forming said buried word line, performing a first common process operation to form at least a portion of a conductive gate electrode in said logic region and to form at least a portion of a conductive bit line in said memory array; and performing a second common process operation to form an active region-to-capacitor conductive contact and a bit line-to-active region conductive contact in said memory array, and to form a conductive contact to a doped region of a transistor formed in said logic area, wherein an upper surface of said active region-to-capacitor conductive contact and an upper surface of said bit line-to-active region conductive contact are at the same level.

11. The method of claim 10, wherein performing said first common process operation to form at least a portion of said gate electrode and at least a portion of said bit line comprises performing at least one of a deposition process, an etching process and a chemical mechanical polishing process.

12. The method of claim 10, wherein said conductive gate electrode in said logic region and said conductive bit line in said memory array comprise the same conductive materials.

13. The method of claim 10, wherein said conductive gate electrode and said conductive bit line are made of at least one metal or metal alloy.

14. The method of claim 11, wherein said conductive gate electrode and said conductive bit line comprise polysilicon.

15. The method of claim 11, wherein said conductive gate electrode in said logic region is a final gate electrode structure for said semiconductor device.

16. The method of claim 11, further comprising after forming said buried word line, removing said conductive gate electrode in said logic region and forming a final conductive gate electrode structure comprising at least one metal layer in place of said removed conductive gate electrode in said logic region.

\* \* \* \* \*

UNITED STATES PATENT AND TRADEMARK OFFICE
CERTIFICATE OF CORRECTION

PATENT NO.         : 8,609,457 B2                                    Page 1 of 1
APPLICATION NO.    : 13/099692
DATED              : December 17, 2013
INVENTOR(S)        : Baars et al.

It is certified that error appears in the above-identified patent and that said Letters Patent is hereby corrected as shown below:

In the Claims

Claim 14, column 11, line 7, delete "claim 11" and insert therefor -- claim 10 --.

Claim 15, column 11, line 9, delete "claim 11" and insert therefor -- claim 10 --.

Claim 16, column 11, line 12, delete "claim 11" and insert therefor -- claim 10 --.

Signed and Sealed this
Twentieth Day of May, 2014

Michelle K. Lee
*Deputy Director of the United States Patent and Trademark Office*